(12) United States Patent
Bang et al.

(10) Patent No.: US 6,379,492 B2
(45) Date of Patent: *Apr. 30, 2002

(54) CORROSION RESISTANT COATING

(75) Inventors: Won Bang, San Jose; Chen-An Chen, Milpitas; Shankar Venkataraman, Santa Clara; Ajay Bhatnagar, Mountain View, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/428,140

(22) Filed: Oct. 26, 1999

Related U.S. Application Data

(60) Provisional application No. 60/106,530, filed on Oct. 31, 1998.

(51) Int. Cl.$^7$ .............................. C23F 1/02; C23C 16/00
(52) U.S. Cl. ..................... 156/345; 118/715; 118/725; 118/728
(58) Field of Search ............................... 118/725, 728, 118/724, 715; 156/345

(56) References Cited

U.S. PATENT DOCUMENTS

| | | | |
|---|---|---|---|
| 5,304,248 A | * | 4/1994 | Cheng et al. ............... 118/728 |
| 5,364,496 A | | 11/1994 | Bollinger et al. ........... 156/643 |
| 5,597,495 A | * | 1/1997 | Keil et al. .................... 216/66 |
| 5,805,973 A | | 9/1998 | Coffinberry et al. ........ 428/551 |
| 5,959,409 A | * | 9/1999 | Dornfest et al. ........ 315/111.21 |
| 6,139,983 A | * | 10/2000 | Ohashi ....................... 428/698 |
| 6,146,456 A | * | 11/2000 | Mizugaki et al. .............. 117/2 |
| 6,235,120 B1 | * | 5/2001 | Banget et al. ............... 118/725 |

FOREIGN PATENT DOCUMENTS

| | | | |
|---|---|---|---|
| EP | 0 702 098 A1 | 3/1996 | ........... C23C/16/44 |

\* cited by examiner

*Primary Examiner*—Jeffrie R. Lund
(74) *Attorney, Agent, or Firm*—Moser, Patterson & Sheridan, LLP

(57) ABSTRACT

A corrosion resistant part comprising a protective coating formed upon a component part. The protective coating comprises magnesium fluoride, which is substantially pure and substantially dense. Preferably, the coating is at least about 99% pure and at least about 85% dense. For example, such a coating can be formed upon the component part at a temperature of at least about 250° C. and a pressure of not more than about $1 \times 10^{-5}$ torr. The resulting coating is effective in protecting the surfaces of an aluminum nitride heater against corrosion within a fluorine-containing environment inside a chemical vapor deposition chamber.

11 Claims, 2 Drawing Sheets

CORROSION RESISTANT COATING

CROSS REFERENCE TO RELATED APPLICATIONS

This application claims priority to U.S. provisional application Ser. No. 60/106,530, entitled "Improved Corrosion Resistant Coating," filed on Oct. 31, 1998, which is herein incorporated by reference. This application is related to commonly-assigned U.S. patent application Ser. No. 09/427,777 entitled "Corrosion Resistant Coating," filed simultaneously herewith; which is herein incorporated by reference.

BACKGROUND OF THE DISCLOSURE

1. Field of the Invention

The invention relates generally to a corrosion resistant coating, and in particular, to a coating for use on a component in a corrosive environment of a semiconductor wafer processing system.

2. Description of the Background Art

In a semiconductor wafer processing system, the interior of a processing chamber is often exposed to a variety of corrosive or reactive environments. These reactive environments may result from either corrosive stable gases, e.g., chlorine ($Cl_2$), or other reactive species, including radicals or by-products generated from process reactions. In plasma process applications such as etching or chemical vapor deposition (CVD), reactive species are also generated through dissociation of other molecules, which by themselves, may or may not be corrosive or reactive. Corrosion resistant measures are needed to ensure process performance and durability of the process chamber or component parts. Nickel-plated components, for example, are often used in process chambers to prevent corrosion from $Cl_2$. Fluorine-containing gases such as $NF_3$ or $CHF_3$, among others, give rise to atomic fluorine (F) which is highly reactive. Corrosion becomes even worse under high temperature environments, such as those encountered in certain CVD applications. For example, ceramic heaters made of aluminum nitride (AlN) are attacked by $NF_3$, which is often used as a cleaning gas in some wafer processing systems. These heaters are typically rather expensive, and it is desirable to have protective coatings which can prevent corrosion of the heater surfaces.

Therefore, a need exists in the art to provide corrosion resistant coatings that can protect process components, such as ceramic heaters, from corrosion within wafer processing systems.

SUMMARY OF THE INVENTION

The present invention provides a protective coating upon a component part for use in a corrosive or reactive environment. The protective coating comprises magnesium fluoride that is sufficiently pure to avoid reactions between contaminants in the coating and reactive species in the surrounding environment. Furthermore, the coating is sufficiently dense to preclude reactive species from penetrating the coating and reaching the underlying component part. In one embodiment, the magnesium fluoride coating is at least 85% dense, e.g., about 85–90% dense, and at least 99% pure. Such a coating, for example, protects a ceramic heater surface against chemical attack by fluorine radicals in a high temperature corrosive environment.

In another preferred embodiment, the component part (e.g., aluminum nitride heater) is provided with a surface finish better than about 10 RA, or preferably, between 5–10 RA. The coating formed upon such a component part is more uniform, and thus provides more effective protection against corrosion.

The quality of the protective coating is also affected by the process condition of the deposition. Therefore, another aspect of the invention is a method of forming the coating at a temperature and pressure that are appropriate for the desired coating density and purity. In general, it is preferable that the coating be formed at a relatively high temperature and relatively low pressure. A high deposition temperature tends to yield a higher density coating, while a low pressure results in a coating with a higher purity. In one preferred embodiment, the coating is deposited at a temperature of at least about 250° C., or preferably at least about 300° C., and a chamber pressure of lower than about $1 \times 10^{-5}$ torr. Further improvement in the coating characteristics can be achieved by annealing the coating at a temperature greater than about 600° C.

BRIEF DESCRIPTION OF THE DRAWINGS

The teachings of the present invention can readily be understood by considering the following detailed description in conjunction with the accompanying drawings, in which.

To facilitate understanding, identical reference numerals have been used, where possible, to designate identical elements that are common to the figures.

DETAILED DESCRIPTION

Figure 1A:
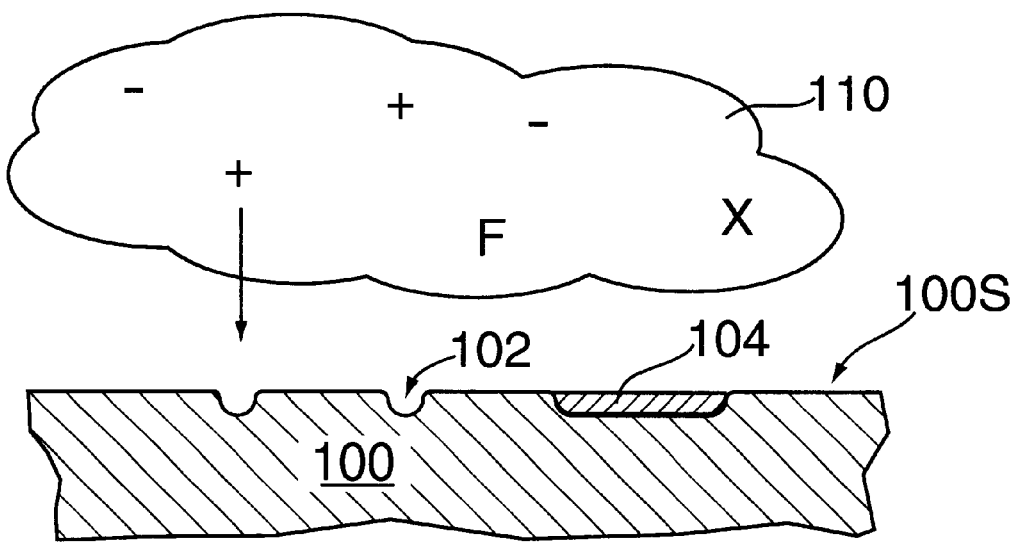
FIG. 1a depicts a schematic cross-sectional view of a substrate exposed to a corrosive environment.
Figure 1B:
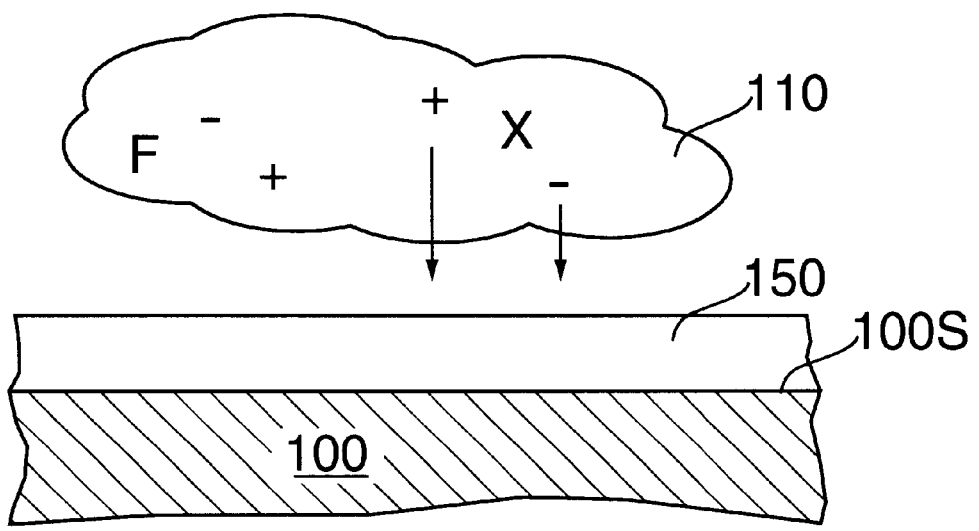
FIG. 1b depicts a schematic cross-sectional view of a coating of the present invention formed upon a substrate.

The present invention relates to a fluorine-containing coating that protects an underlying substrate (i.e., the object on which the coating is deposited) or component part from corrosion or deterioration within a corrosive environment. FIGS. 1a–b schematically illustrate the protective effect of a coating 150 upon a substrate 100. FIG. 1a depicts a cross-sectional view of a substrate 100 exposed to a generally corrosive or reactive environment 110. For example, the substrate 100 may be subjected to attack by species in the surrounding environment 110, resulting in pits 102 or other defects 104 on the surface 100S of the substrate 100. Depending on the reactive environment 110, deterioration of the substrate 100 may be caused by chemical or physical attacks, and may not necessarily result in readily visible defects such as those illustrated in FIG. 1a. For example, chemical or physical characteristics of the substrate 100 may be altered by chemical reactions between species such as fluorine F, or other reactive species (denoted generally as X) in the environment 110 and the substrate 100, or by physical bombardment of energetic species (e.g., + and –ions). FIG. 1b illustrates a cross-sectional view of the substrate 100 being exposed to the corrosive environment 110 after a coating 150 has been formed upon the substrate 100. The coating 150 of the present invention is resistant to attack by the reactive or corrosive environment 110, and deterioration of the underlying substrate 100 can be reduced or avoided.

In one embodiment of the invention, the coating 150 comprises magnesium fluoride, which is used to coat interior surfaces of chemical vapor deposition (CVD) chambers and/or component parts used in such chambers. For example, the inventive coating 150 is advantageously applied to aluminum or aluminum nitride parts such as the heaters conventionally employed within CVD chambers. Aluminum and aluminum nitride typically corrode and deteriorate with time when they are repeatedly exposed to high temperature CVD process environments. The coating 150 prevents corrosion of the heater surface under a corrosive environment, e.g., in the presence of a plasma containing fluorine (F), at temperatures above 550° C.

To be an effective protective coating in a corrosive environment 110, the magnesium fluoride coating 150 should be sufficiently pure so as to substantially eliminate reactions between contaminants in the coating 150 and various species in the surrounding environment 110. The type of contaminants varies with the specific process used in forming the coating 150. For example, the magnesium fluoride coating 150 may be formed by high temperature evaporation of magnesium fluoride crystals contained in a crucible, or by sputtering a magnesium fluoride target using an inert gas, e.g., argon (Ar), nitrogen ($N_2$), and the like. Contaminants in the coating 150 may include impurities from the sputtering target, impurities from the crucible, e.g., alumina ($Al_2O_3$), or impurities such as water vapor in the process chamber, among others. It is desirable that the purity of the magnesium fluoride coating, e.g., (sum of weights of magnesium and fluorine)/(sum of weights of magnesium and fluorine+sum of weights of all impurities), is at least 99% and, more preferably, as close to 100% as possible.

Furthermore, the coating 150 should be sufficiently dense to substantially prevent species in the corrosive environment 110 from penetrating through porous regions of the coating 150, and attacking the underlying substrate 100. The density of the magnesium fluoride coating can be defined as: volume of magnesium fluoride in the coating/total volume of (voids plus magnesium fluoride plus other impurities) in the coating. A higher density tends to reduce the probability of exposing the underlying part (e.g., AlN) to attack by corrosive gases. Thus, while a coating density of about 70–80% is sufficient to protect the underlying substrate 100, the density of the magnesium fluoride coating 150 is desirably at least 85%, or more preferably, at least about 95%, or close to about 100%. Furthermore, to avoid cracking of the coating 150, a thinner coating is generally preferred, while a more conformal coating 150 provides improved protection of the underlying substrate. To achieve these characteristics, the magnesium fluoride coating 150 is preferably deposited by CVD or by physical vapor deposition (PVD). The coating 150 has, for example, a thickness of less than about 2 $\mu$m, or preferably, about 1 $\mu$m or less. Such a magnesium fluoride coating 150, for example, has been found to resist corrosion in environments containing dissociated $NF_3$ (e.g., environments containing fluorine radicals) and having temperatures above 550° C.

Figure 3:
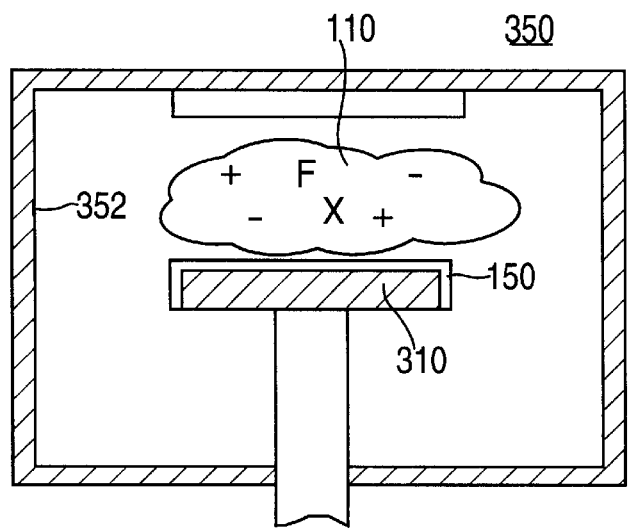
FIG. 3 depicts a schematic-diagram of a chamber with a support pedestal having a coating of the present invention.

FIG. 3 illustrates one embodiment of the present invention, in which the magnesium fluoride coating 150 is formed upon a support pedestal 310. In particular, the support pedestal 310 is a ceramic heater made of aluminum nitride (AlN). An AlN heater 310, for example, is often used in a wafer processing system 350, such as a CVD chamber, for heating a wafer (not shown) to a high processing temperature. Any exposed surface of the AlN heater 310 is susceptible to attack upon exposure to a corrosive environment 110—e.g., components in the process gases, or a plasma containing a chamber cleaning gas such as $NF_3$. In a CVD chamber configured for oxide (e.g., $SiO_2$) deposition, oxide is deposited both on the surface of a wafer, as well as upon the interior surfaces 352 of the chamber 350 and other component parts, e.g., heater 310, inside the chamber 350. To maintain efficient process and chamber operation, the oxide deposits must be removed from the interior chamber surfaces 352 and component parts. This is typically achieved via a cleaning step that employs a fluorine-containing gas such as $NF_3$ to etch away the oxide deposits. The magnesium fluoride coating 150 of the present invention is resistant to attack (either chemically or physically) by many reactive species within a CVD process environment, and is therefore effective as a protective coating for use with ceramic heaters in general. For example, a magnesium fluoride coating 150 has been successfully used to avoid deterioration of an aluminum nitride heater 310 in the presence of a plasma containing fluorine (F), at temperatures above 550° C.

Another aspect of the invention includes a method of making parts for use within a corrosive environment. The method comprises coating each part, or substrate, with a substantially dense (e.g., greater than about 85%) and substantially pure magnesium fluoride coating, preferably deposited by CVD or PVD.

In general, a coating having a relatively high density is less vulnerable to attack by corrosive or reactive species. As such, a relatively high deposition temperature is preferred because it results in a denser coating, along with improved conformality and adhesion characteristics. To achieve a magnesium fluoride coating 150 having close to 100% density, the coating 150 is deposited at a temperature of at least about 300° C. However, for coating densities in the 85–90% range, the temperature may be somewhat lower, e.g., at least 250° C., or about 275° C.

The magnesium fluoride coating 150 may be formed by different processes, including for example, high temperature evaporation and sputtering (e.g., PVD). However, the specific coating process is not critical to the practice of the present invention, as long as the process result in a sufficiently dense and pure coating 150. For example, electron beam vaporization has been used in forming a magnesium fluoride coating over an AlN heater. In other applications, however, conformal deposition—e.g., using CVD, may be desirable in order to ensure complete coverage, or protection, for substrates with topography.

When a magnesium fluoride coating is deposited using electron beam vaporization, it is typically performed at a temperature of about 250° C. and a pressure of about $1 \times 10^{-5}$ torr. The resulting coating has a columnar structure, and is about 70–80% dense. As such, corrosive gases are able to penetrate the relatively porous coating and attack the underlying substrate. By contrast, in one embodiment of the present invention, a magnesium fluoride coating 150 is formed, using electron beam vaporization, at a temperature greater than about 300° C. The resulting coating 150 has a higher density, e.g., close to 100%, and is less porous than coatings deposited at lower temperatures. As such, the improved coating provides better protection for the underlying substrate in corrosive environments. Alternatively, the columnar structure of the resulting coating may also be avoided by using other deposition techniques such as sputtering. In the case of PVD, since the species sputtered from the target are relatively energetic, a sufficiently dense film can be formed at a lower temperature compared to other techniques such as evaporation or CVD. Nonetheless, a PVD coating can still benefit from a higher temperature process, which leads to a more conformal and robust film resulting, for example, from improved bonding among the deposited species.

In another embodiment, a magnesium fluoride coating 150 deposited at a lower density (e.g., at a lower temperature) can also be densified by thermal annealing at a temperature greater than about 600° C. For example, densification can be achieved by thermal annealing at about 600° C. for 10 hrs. at a pressure of about 700 torr in an inert nitrogen ($N_2$) atmosphere. Other inert gases, such as argon (Ar), among others, may also be used. Aside from densification, thermal annealing of the coating also improves the conformality of the coating.

To achieve the desired purity, e.g., about 99%, the coating 150 is deposited at the temperatures described above and at a chamber pressure of at least $1\times10^{-5}$ torr i.e., preferably a reduced pressure environment of lower than $1\times10^{-5}$ torr. A chamber pressure of $1\times10^{-6}$ torr provides an environment containing fewer contaminants than at $10^{-5}$ torr, and therefore results in a coating having a higher purity. However, this improvement in coating purity with decreasing pressure becomes less significant at higher deposition temperatures because the denser coating obtained at a higher deposition temperature has fewer porous regions where contaminants (e.g., moisture) may lodge. Therefore, at sufficiently high deposition temperatures, lowering the chamber pressure may not produce a corresponding increase in coating purity. Accordingly, a process for depositing the magnesium fluoride coating 150 will preferably balance temperature and pressure to achieve the desired purity and density. It will be understood, that in order to resist corrosion when the part (e.g., comprising the coating 150 and substrate 100) is exposed to the corrosive environment 110, the coating 150 should cover all surfaces 100S of the substrate 100, that can potentially be exposed to the corrosive environment 110.

Figure 2A:
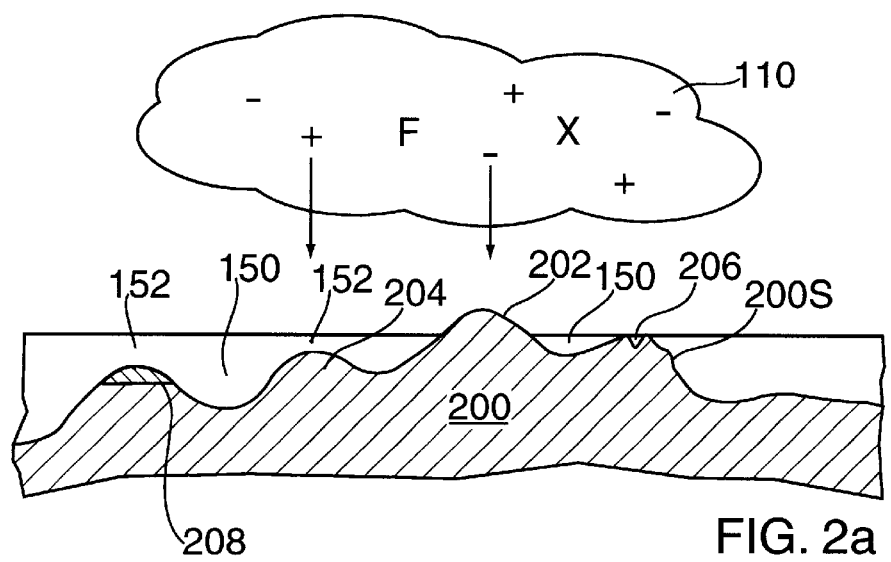
FIG. 2a depicts a schematic cross-sectional view of a coating upon a substrate having a rough surface finish.
Figure 2B:
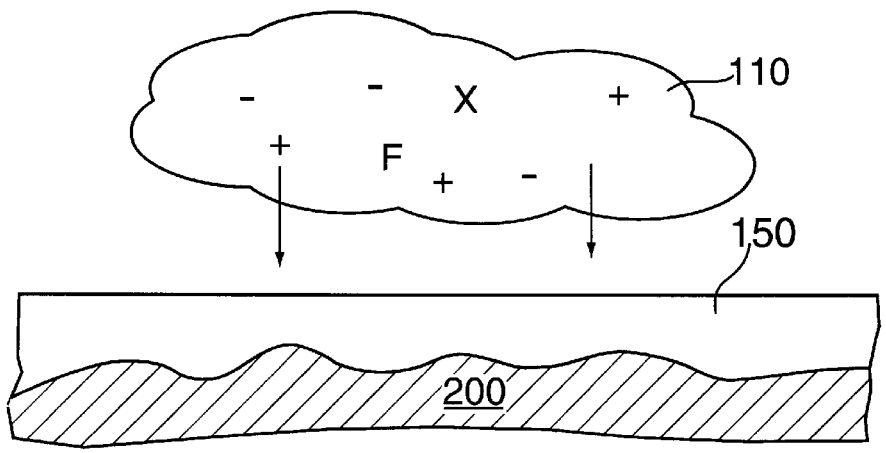
FIG. 2b depicts a schematic cross-sectional view of a coating upon a substrate having a finer surface finish.

Aside from the deposition process conditions (e.g., substrate temperature, chamber pressure, among others), the characteristics of the coating 150 is also affected by the surface finish of the substrate 100. For example, if the surface 100S of the substrate 100 is too rough, then the resulting coating thickness is non-uniform. As such, the underlying substrate 100 becomes vulnerable to attack when exposed to a corrosive environment 110. A ceramic heater typically has a surface finish with a roughness measure of greater than RA20. (For the surface roughness scale, RA20 means that surface "bumps" are about 20 microinches from the average surface.) FIG. 2a illustrates a magnesium fluoride coating 150 upon a substrate 200 such as a heater, with a rough surface 200S. The magnesium fluoride coating 150 is relatively non-uniform, resulting in exposed portions 202 of the heater 200. Alternatively, portions 152 of the coating 150 may also be too thin to be effective in protecting underlying portions 204 of the heater 200 against penetration by reactive or energetic species in the corrosive environment 110. As such, regions 202, 204 of the heater 200 are vulnerable to the corrosive environment 110, resulting in the formation of pits 206 or other defects 208. However, if the underlying heater 200 has a finer surface finish, then both the quality of the coating-substrate interface and the coating uniformity can be improved. As shown in FIG. 2b, the coating 150 formed upon a heater 200 with a smoother surface finish provides effective protection against the reactive environment 110.

Therefore, a substrate (e.g., AlN heater) having a small grain size of less than about 30 $\mu$m is desirable, and in one preferred embodiment, a grain size of about 1–3 $\mu$m is used. The surface finish can further be improved, for example, by appropriate polishing techniques. Illustratively, an optimal surface finish of the substrate surface 200 is less than about RA10, and preferably even lower, e.g., about RA5. In general, it is desirable to have as fine a surface finish as possible. However, the expense also increases with iterative polishing. Therefore, in practice, a surface finish of about RA10, or slightly higher, is recommended. The improvement in the coating-substrate interface leads to better adhesion between the coating 150 and the substrate 200, and a coating uniformity of about 50% is typically obtained.

The specific embodiments disclosed for use with CVD chambers under high temperature conditions are meant to be illustrative only. The present invention is generally applicable to other corrosive environments, such as those commonly encountered in etching, plasma or reactive processes.

Although various embodiments which incorporate the teachings of the present invention have been shown and described in detail herein, those skilled in the art can readily devise many other varied embodiments that still incorporate these teachings.

What is claimed is:

1. Apparatus for use within a corrosive semiconductor device process comprising:

a component part having a surface; and a magnesium fluoride coating deposited upon said surface of said component part; wherein said magnesium fluoride coating has a density of at least about 85% and a purity of at least about 99%; and wherein said magnesium fluoride coating is annealed at a temperature of greater than about 600° C. after being formed upon said surface of said component part.

2. The apparatus as in claim 1, wherein said magnesium fluoride coating has a density of between 85% to 90%.

3. The apparatus as in claim 1, wherein said magnesium fluoride coating has a density of about 100%.

4. The apparatus as in claim 1, wherein said surface of said component part has a surface finish of less than about 10 RA.

5. The apparatus as in claim 1, wherein said magnesium fluoride coating is formed upon said surface of said component part at a temperature of at least about 250° C.

6. The apparatus as in claim 1, wherein said magnesium fluoride coating is formed at a pressure of lower than about $1\times10^{-5}$ torr.

7. The apparatus as in claim 1, wherein said component part is a ceramic heater.

8. The apparatus as in claim 1, wherein said component part comprises aluminum nitride or aluminum.

9. A semiconductor device processing chamber, comprising:

a support pedestal;

a magnesium fluoride coating covering said support pedestal; wherein said magnesium fluoride coating has a density of at least about 85% and a purity of at least about 99%; and wherein said magnesium fluoride coating is annealed at a temperature of greater than about 600° C. after being formed upon said surface of said component part.

10. The semiconductor device processing chamber of claim 9, wherein said support pedestal is a ceramic heater.

11. The semiconductor device processing chamber of claim 9, wherein said support pedestal comprises aluminum nitride or aluminum.

* * * * *